US012627281B2

(12) United States Patent
Tseng et al.

(10) Patent No.: US 12,627,281 B2
(45) Date of Patent: May 12, 2026

(54) MULTI-LEVEL DIGITAL STEP ATTENUATOR AND DIGITAL STEP ATTENUATION DEVICE

(71) Applicant: MEDIATEK INC., Hsinchu (TW)

(72) Inventors: Wei-Hsin Tseng, Hsinchu (TW);
Jhen-Kai Wang, Hsinchu (TW)

(73) Assignee: MEDIATEK INC., Hsinchu City (TW)

( * ) Notice: Subject to any disclaimer, the term of this patent is extended or adjusted under 35 U.S.C. 154(b) by 155 days.

(21) Appl. No.: 18/395,930

(22) Filed: Dec. 26, 2023

(65) Prior Publication Data

US 2024/0243732 A1 Jul. 18, 2024

Related U.S. Application Data

(60) Provisional application No. 63/480,314, filed on Jan. 18, 2023.

(51) Int. Cl.
*H03H 17/00* (2006.01)
*H03H 7/25* (2006.01)
*H03H 11/24* (2006.01)

(52) U.S. Cl.
CPC .......... *H03H 17/0054* (2013.01); *H03H 7/25* (2013.01); *H03H 11/24* (2013.01)

(58) Field of Classification Search
CPC ....... H03H 17/0054; H03H 7/25; H03H 11/24
USPC ....................................................... 333/81 R
See application file for complete search history.

(56) References Cited

U.S. PATENT DOCUMENTS

2018/0062622 A1 3/2018 Yan

FOREIGN PATENT DOCUMENTS

CN 114244316 A 3/2022

OTHER PUBLICATIONS

CN114244316 English Translation (Year: 2021).*
Extended European Search Report dated Jun. 27, 2024, issued in application No. EP 24152638.3.
Song, I., et al.; "Design and Analysis of a Low Loss, Wideband Digital Step Attenuator With Minimized Amplitude and Phase Variations;" IEEE Journal of Solid-State Circuits; vol. 53; No. 8; Aug. 2018; pp. 2202-2213.

* cited by examiner

*Primary Examiner* — Andrea Lindgren Baltzell
*Assistant Examiner* — Abigail Amir Yaldo
(74) *Attorney, Agent, or Firm* — McClure, Qualey & Rodack, LLP

(57) ABSTRACT

A multi-level digital step attenuator (DSA) with a hybrid attenuation circuit is shown. The hybrid attenuation circuit is coupled between an input node and an output node of the multi-level DSA. The bypass switch of the multi-level DSA is controlled to provide a bypass path between the input node and the output node of the of the multi-level DSA when the hybrid attenuation circuit is in a disabled state. In the first active state, the hybrid attenuation circuit is switched to form a T-type structure to provide a first amount of signal attenuation. In the second active state, the hybrid attenuation circuit is switched to form a Pi-type structure to provide a second amount of signal attenuation.

13 Claims, 4 Drawing Sheets

1

MULTI-LEVEL DIGITAL STEP ATTENUATOR AND DIGITAL STEP ATTENUATION DEVICE

CROSS REFERENCE TO RELATED APPLICATIONS

This application claims the benefit of U.S. Provisional Application No. 63/480,314, filed Jan. 18, 2023, the entirety of which is incorporated by reference herein

BACKGROUND OF THE INVENTION

Field of the Invention

The present invention relates to a digital step attenuation technology.

Description of the Related Art

In radio signal (RF) applications, a digital step attenuator (DSA) is a device that attenuates or reduces the amplitude of the RF signal that passes through it. The channel gain of the wireless receiver or transmitter (Rx/Tx), therefore, can be well controlled. The accuracy of the DSA will affect the reliability of the gain range of the channel, and therefore determine the usability of the Rx/Tx.

Generally, the amount of attenuation is controlled digitally. A conventional DSA can be digitally switched between two modes. In an attenuation mode, the RF signal is attenuated by an attenuation circuit of the DSA. In a normal bypass mode, the RF signal is allowed to pass through by a bypass switch rather than by the attenuation circuit.

Multiple DSAs may be coupled in series to provide more levels of signal attenuation. However, more stages may require more complex LC matching networks for wideband impedance matching.

How to reduce the number of DSA stages is an important topic in this field of technology.

BRIEF SUMMARY OF THE INVENTION

A multi-level digital step attenuator (DSA) with a single bypass switch and a hybrid attenuation circuit is shown.

A multi-level DSA in accordance with an exemplary embodiment of the disclosure has a hybrid attenuation circuit and a bypass switch. The hybrid attenuation circuit is coupled between an input node and an output node of the multi-level DSA. The bypass switch is controlled to provide a bypass path between the input node and the output node of the multi-level DSA when the hybrid attenuation circuit is in a disabled state. In a first active state, the hybrid attenuation circuit is switched to form a T-type structure to provide a first amount of signal attenuation. In a second active state, the hybrid attenuation circuit is switched to from a Pi-type structure to provide a second amount of signal attenuation.

The proposed multi-level DSA is controlled by a 2-bit control signal to switch the hybrid attenuation circuit between the disabled state, the first active state and the second active state. A 2-bit control signals, 3 states, and single bypass switch 1.5-bit-DSA is shown. In comparison with the conventional DSA design, fewer stages of DSAs are required for wide-range and high resolution attenuation.

In an exemplary embodiment, the hybrid attenuation circuit has a first electronic component and a second electronic component coupled in series between the input node and the output node of the multi-level DSA. The hybrid attenuation circuit further has a third electronic component that couples a connection node between the first electronic component and the second electronic component to a ground terminal when the hybrid attenuation circuit is in the first active state. A T-type structure is formed by the first, second and third electronic components.

In an exemplary embodiment, the hybrid attenuation circuit further has a fourth electronic component and a fifth electronic component. The fourth electronic component is coupled between the input node of the multi-level DSA and the ground terminal when the hybrid attenuation circuit is in the second active state. The fifth electronic component is coupled between the output node of the multi-level DSA and the ground terminal when the hybrid attenuation circuit is in the second active state. A Pi-type structure is formed by the first, second, fourth and fifth electronic components.

In another exemplary embodiment, the hybrid attenuation circuit further has a sixth electronic component coupled between the input node and the output node of the multi-level DSA when the hybrid attenuation circuit is in the second active state. The first, second, fourth, fifth, and sixth electronic components also form a Pi-type structure. In an exemplary embodiment, n is a positive integer. The T-type structure formed by the first, second, and third electronic components provides signal attenuation of $2^n$ dB, and the Pi-type structure formed by the first, second, fourth, fifth and sixth electronic components provides signal attenuation of $2^{(n-1)}$ dB. It is convenient for digital design.

In an exemplary embodiment, a digital step attenuation device formed by multiple stages of digital step attenuation units is shown. At least one digital step attenuation unit in the multiple stages is implemented by the aforementioned multi-level DSA.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
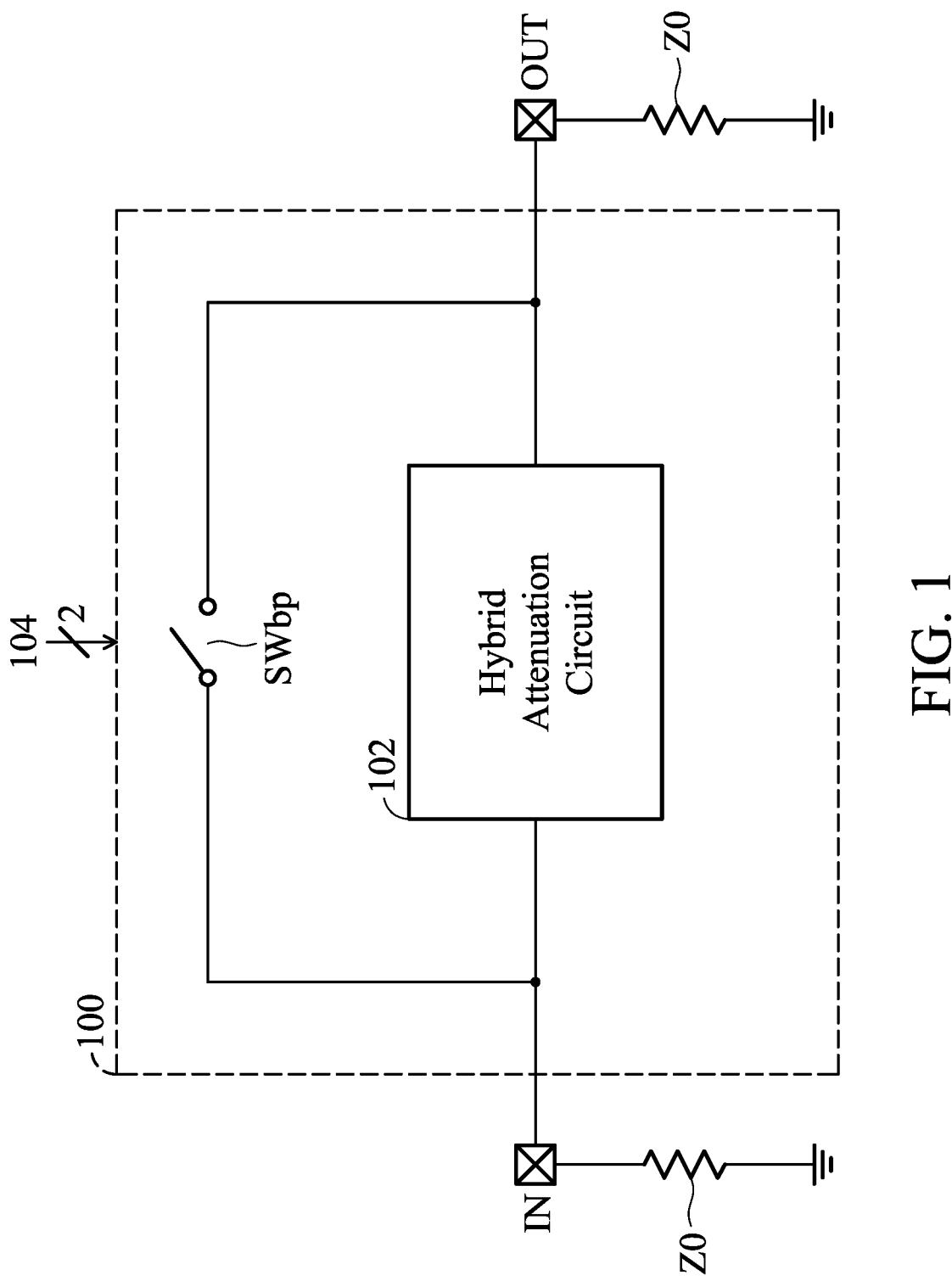
FIG. 1 depicts a multi-level digital step attenuator (DSA) 100 in accordance with an exemplary embodiment of the disclosure.

FIG. 1 depicts a multi-level digital step attenuator (DSA) 100 in accordance with an exemplary embodiment of the disclosure.

The multi-level DSA 100 has a hybrid attenuation circuit 102 and a bypass switch SWbp. The hybrid attenuation circuit 102 is coupled between an input node IN and an output node OUT of the multi-level DSA 100. The bypass switch SWbp is controlled to provide a bypass path between the input node IN and the output node OUT of the multi-level DSA 100 when the hybrid attenuation circuit 102 is in a disabled state. When the signal attenuation is enabled, the hybrid attenuation circuit 102 provides multiple options for effective signal attenuation. When being operated in a first active state, the hybrid attenuation circuit 102 is switched to form a T-type structure to provide a first amount of signal attenuation. When being operated in a second active state, the hybrid attenuation circuit 102 is switched to form a Pi-type structure to provide a second amount of signal attenuation.

In an exemplary embodiment, the multi-level DSA 100 is controlled by a 2-bit control signal 104 to switch the hybrid attenuation circuit 102 between the disabled state, the first active state, and the second active state. A 1.5-bit DSA is shown. In comparison with the conventional DSA design which requires a long series of DSAs to provide the multiple options for effective signal attenuation, the proposed multi-level DSA reduces the number of DSA stages. Fewer stages of DSAs are required for multi-level attenuation.

The impedance Z0 presented at the input node IN is the impedance of the former stage. The impedance Z0 presented at the output node OUT is the impedance of the next stage. The impedance of each electronic component of the hybrid attenuation circuit 102 depends on the attenuation target and the impedance Z0 of the former/next stage.

Figure 2:
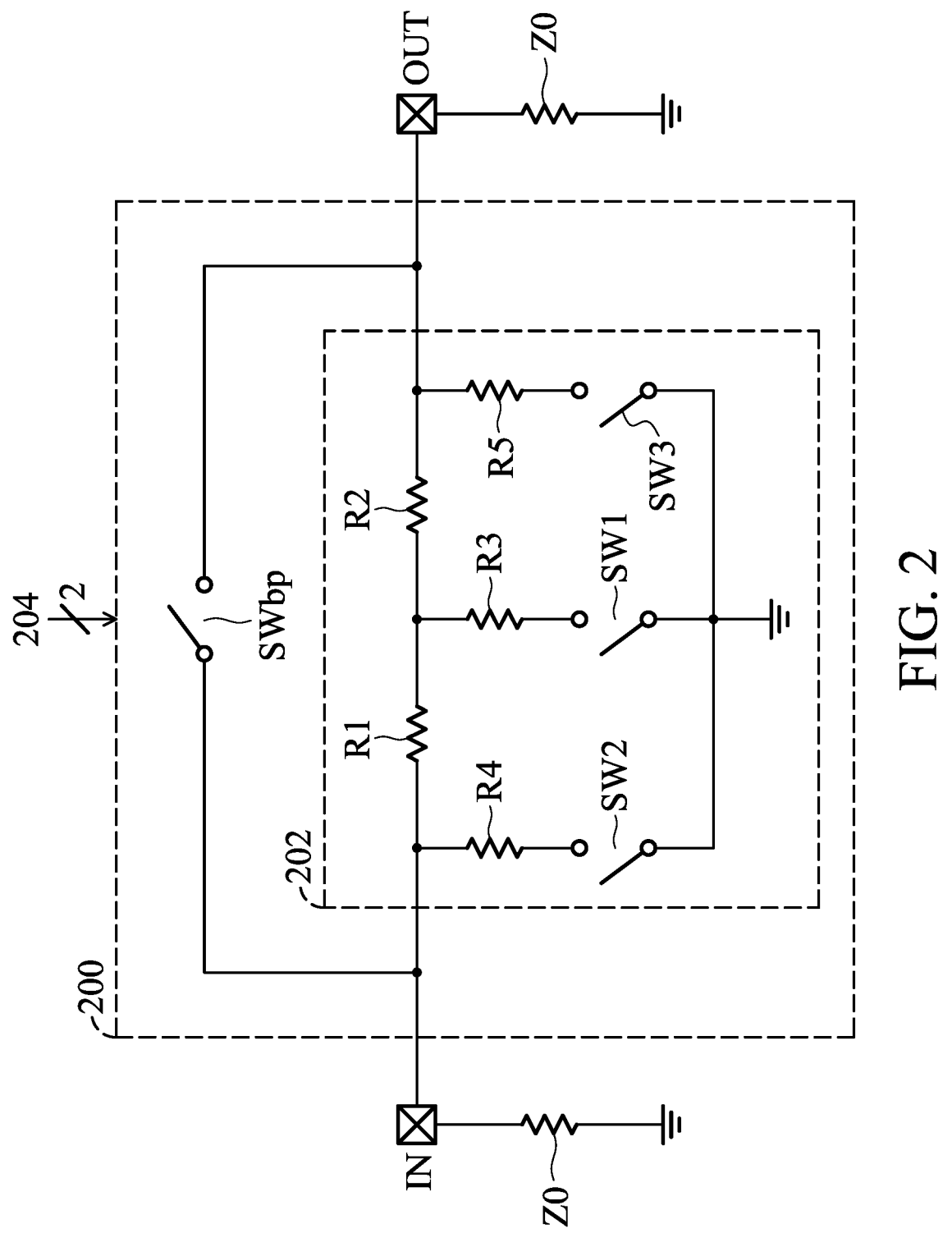
FIG. 2 depicts a multi-level DSA 200 in accordance with an exemplary embodiment of the disclosure.

FIG. 2 depicts a multi-level DSA 200 in accordance with an exemplary embodiment of the disclosure.

The hybrid attenuation circuit 202 has a first resistor R1 and a second resistor R2 coupled in series between the input node IN and the output node OUT of the multi-level DSA 200. The hybrid attenuation circuit 202 further has a third resistor R3. When the switch SW1 is turned on to operate the hybrid attenuation circuit 202 in the first active state, the third resistor R3 couples a connection node between the first resistor R1 and the second resistor R2 to a ground terminal. The first, second, and third resistors R1, R2, and R3 form a T-type structure that generates the first amount of signal attenuation.

The hybrid attenuation circuit 202 further has a fourth resistor R4 and a fifth resistor R5. When the switches SW2 and SW3 are turned on to operate the hybrid attenuation circuit 202 in the second active state, the fourth resistor R4 is coupled between the input node IN of the multi-level DSA 200 and the ground terminal, and the fifth electronic component R5 is coupled between the output node OUT of the multi-level DSA 200 and the ground terminal. The first, second, fourth and fifth resistors R1, R2, R4, and R5 form a Pi-type structure that generates the second amount of signal attenuation.

In an exemplary embodiment, the multi-level DSA 200 is controlled by a 2-bit control signal 204. By controlling the 2-bit control signal 204, the switches SW1, SW2, and SW3 can be turned off, and the bypass switch SWbp can be turned on to operate the hybrid attenuation circuit 202 in its disabled state. When the switch SW1 is turned on, and the switches SW2 and SW3 are turned off with the bypass switch SWbp by the 2-bit control signal 204, the hybrid attenuation circuit 202 operates in its first active state to form the T-type structure to provide the first amount of signal attenuation. When the switches SW2 and SW3 are turned on, and the switch SW1 is turned off with the bypass switch SWbp by the 2-bit control signal 204, the hybrid attenuation circuit 202 operates in its second active state to form the Pi-type structure to provide the second amount of signal attenuation.

The first amout of signal attenuation may be $2^n$ dB, but not limited thereto. In the other exemplary embodiments, the first amout of signal attenuation may be any attenuation of non-radix-2.

In an exemplary embodiment, the T-type structure formed by the first, second, and third resistors R1, R2, and R3 provides signal attenuation of $2^n$ dB. For example, the impedance Z0 may be 50 ohm, the first resistor R1 and the second resistor R2 each may have a resistance of 36 ohm, and the third R3 may have a resistance of 16 ohm. The T-type structure formed by the first, second, and third resistors R1, R2, and R3 provides signal attenuation of 16 dB (=$2^4$ dB). In another exemplary embodiment, with the 36 ohm resistors R1 and R2 and the 50 ohm Z0, the fourth and the fifth resistors R4 and R5 each has a resistance of 96 ohm. The Pi-type structure formed by the first, second, fourth, and fifth resistors R1, R2, R4, and R5 provides signal attenuation of 10 dB (attenuation of non-radix-2). The detailed resistance values may be replaced by the other values, depending on the user's needs.

Figure 3:
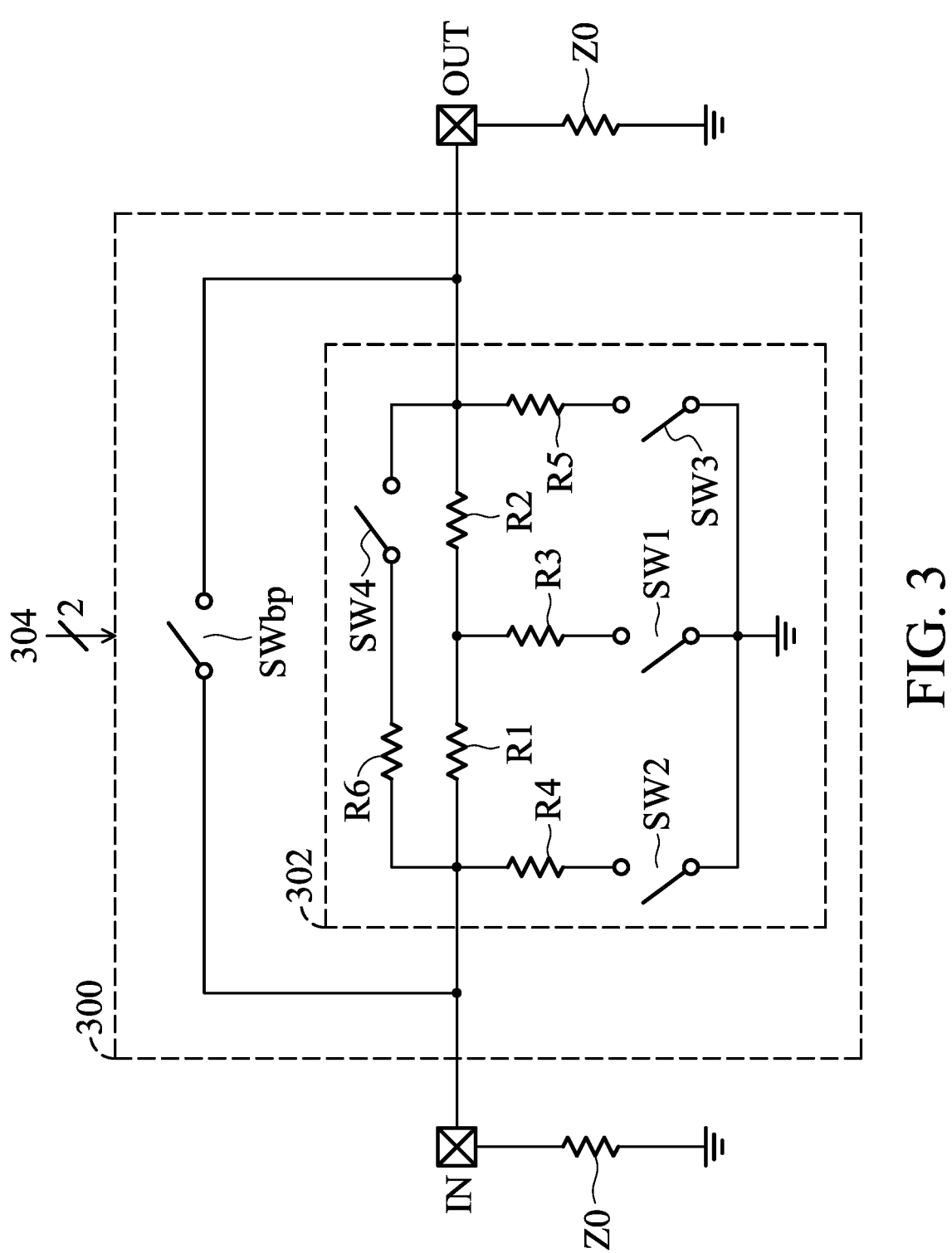
FIG. 3 depicts a multi-level DSA 300 in accordance with another exemplary embodiment of the disclosure shows.

FIG. 3 depicts a multi-level DSA 300 in accordance with another exemplary embodiment of the disclosure. The hybrid attenuation circuit 302 further includes a sixth resistor R6 in comparison with the hybrid attenuation circuit 202. When the switch SW4 is turned on with the switches SW2 and SW3 to operate the hybrid attenuation circuit 302 in its second active state, the sixth resistor R6 is coupled between the input node IN and the output node OUT of the multi-level DSA 300, to being in parallel with the series of first and second resistors R1 and R2. The first, second, fourth, fifth, and sixth resistors R1, R2, R4, R5, and R6 also form a Pi-type structure that generates another amount of signal attenuation.

In an exemplary embodiment wherein the T-type structure (formed by the first, second, and third resistors R1, R2, and R3) provides signal attenuation of $2^n$ dB, the Pi-type structure (formed by first, second, fourth, fifth, and sixth resistors R1, R2, R4, R5, and R6) provides signal attenuation of $2^{(n-1)}$ dB. It is convenient to digital design.

In an exemplary embodiment, with the 36 ohm resistors R1 and R2, 16 ohm resistor R3, and the 50 ohm Z0, the fourth and the fifth resistors R4 and R5 each has a resistance of 116 ohm. Not only the T-type structure formed by the first, second, and third resistors R1, R2, and R3 provides 16 dB signal attenuation that is in a power of 2, the Pi-type structure formed by the first, second, fourth, fifth, and sixth resistors R1, R2, R4, R5, and R6 provides signal attenuation of 8 dB, which is also in a power of 2.

In an exemplary embodiment, the multi-level DSA 300 is controlled by a 2-bit control signal 304. To switch the hybrid attenuation circuit 302 to its disabled state, the switches SW1, SW2, and SW3 are turned off, and the bypass switch SWbp is turned on by the 2-bit control signal 304. To switch the hybrid attenuation circuit 302 to its first active state to form the T-type structure to provide the first amount of signal attenuation, the switch SW1 is turned on, and the switches SW2, SW3 and SW4 are turned off with the bypass switch SWbp by the 2-bit control signal 304. To switch the hybrid attenuation circuit 302 to its second active state to form the Pi-type structure to provide the second amount of signal attenuation, the switches SW2, SW3 and SW4 are turned on, and the switch SW1 is turned off with the bypass switch SWbp by the 2-bit control signal 304.

In the other exemplary embodiments, the resistors used in the hybrid attenuation circuit 202/302 may be replaced by other types of electronic components. Any attenuation circuit capable of being switched to form a T-type structure in a first active state and form a Pi-type structure in a second state should be considered within the scope of the disclosure.

Figure 4:
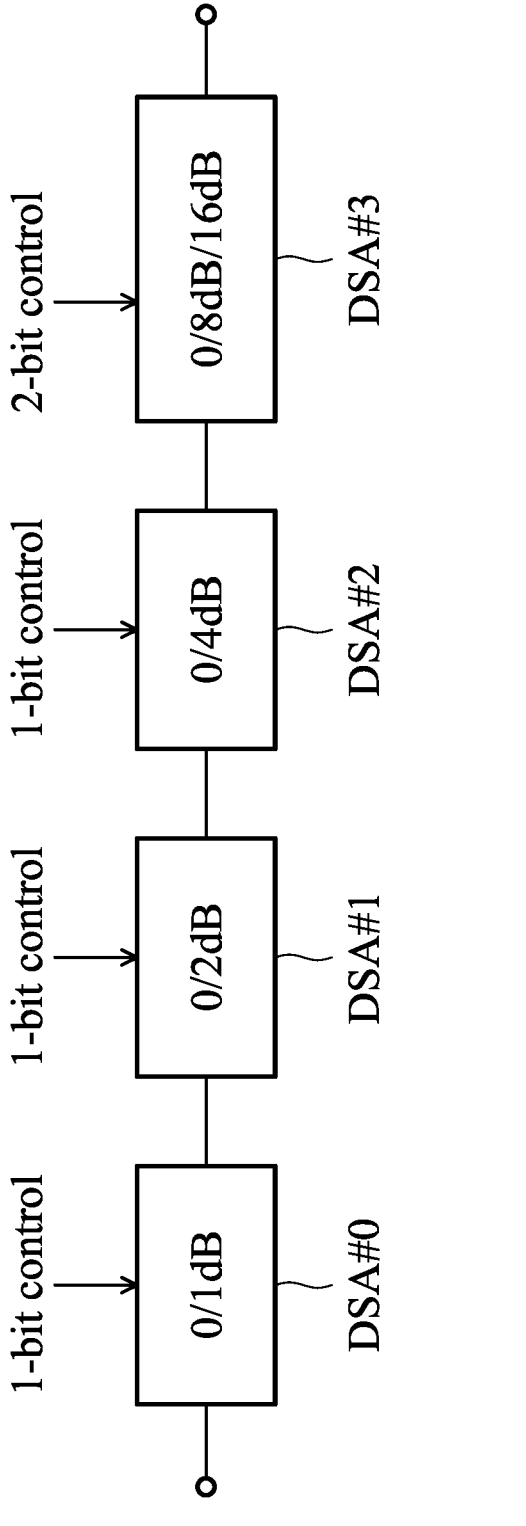
FIG. 4 depicts a digital step attenuation device 400 in accordance with an exemplary embodiment of the disclosure.

FIG. 4 depicts a digital step attenuation device 400 in accordance with an exemplary embodiment of the disclosure, which includes 4 stages of digital step attenuation units DSA #0, DSA #1, DSA #2, and DSA #3. The digital step attenuation unit DSA #3 in the final stage is the proposed multi-level DSA 300, that is capable of providing signal attenuation of 8 dB or 16 dB. The digital step attenuation unit DSA #0 in the number 0 stage is capable of providing signal attenuation of 1 dB (=2^0 dB). The digital step attenuation unit DSA #1 in the number 1 stage is capable of providing signal attenuation of 2 dB (=2^1 dB). The digital step attenuation unit DSA #2 in the number 2 stage is capable of providing signal attenuation of 4 dB (=2^2 dB). The first three digital step attenuation units DSA #0 to DSA #2 each is controlled by a 1-bit control signal. The final digital step attenuation unit DSA #3 is controlled by a 2-bit control signal. In such a design, the digital step attenuation device 400 can generate 24-level signal attenuation from 0 dB to 23 dB according to a 5-bit control signal. It is more attenuation levels in comparison with a conventional 4-stage digital step attenuation device that only provides 16-level signal attenuation from 0 dB to 15 dB.

In a conventional design, signal attenuation of 20 dB requires 5 stages of conventional digital step attenuation units. However, the 20 dB attenuation can be successfully achieved by the 4-stage digital step attenuation device 400. The fewer LC matching networks for impedance matching are used in the fewer stage design, which results in the improved circuit area efficiency, and the reduced insertion loss.

In an exemplary embodiment, a digital step attenuation device includes m stages of digital step attenuation units, and the stages are numbered from 0 to (m−1), where m is any positive integer greater than 1. At least one digital step attenuation unit in the m stages is implemented by the multi-level DSA 100.

In an exemplary embodiment, the digital step attenuation unit implemented by the multi-level DSA 100 is in the number (m−1) stage (e.g., the final stage as FIG. 4). When the multi-level DSA 100 in the number (m−1) stage is switched to its T-type structure, it provides signal attenuation of 2^m dB. When the multi-level DSA 100 in the number (m−1) stage is switched to its Pi-type structure, it provides signal attenuation of 2^(m−1) dB. The digital step attenuation units in the number 0 to the number (m−2) stages are capable of providing signal attenuation of 2^0 dB to 2^(m−2) dB, respectively. In such a design, the m-stage digital step attenuation device is capable of providing more than 2^m attenuation levels. The fewer LC matching networks are required in comparison with the conventional (m+1)-stage digital step attenuation device that is designed to provide more than 2^m attenuation levels.

Any digital step attenuation device using at least one of the proposed multi-level DSA 100 should be considered within the scope of the disclosure.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-level digital step attenuator, comprising:
   a hybrid attenuation circuit, coupled between an input node and an output node of the multi-level digital step attenuator, wherein the hybrid attenuation circuit comprises:
   a first electronic component and a second electronic component, coupled in series between the input node and the output node of the multi-level digital step attenuator;
   a third electronic component, coupling a connection node between the first electronic component and the second electronic component to a ground terminal in a first active state of the hybrid attenuation circuit, to form a T-type structure with the first electronic component and the second electronic component and so that the hybrid attenuation circuit in the first active state provides a first amount of signal attenuation; and
   a fourth electronic component and a fifth electronic component, wherein in a second active state of the hybrid attenuation circuit, the fourth electronic component is coupled between the input node of the multi-level digital step attenuator and the ground terminal, and the fifth electronic component is coupled between the output node of the multi-level digital step attenuator and the ground terminal, to form a Pi-type structure with the first electronic component and the second electronic component and so that the hybrid attenuation circuit in the second active state provides a second amount of signal attenuation;
   a bypass switch, controlled to provide a bypass path between the input node and the output node of the multi-level digital step attenuator when the hybrid attenuation circuit is in a disabled state.

2. The multi-level digital step attenuator as claimed in claim 1, controlled by a 2-bit control signal to switch the hybrid attenuation circuit between the disabled state, the first active state and the second active state.

3. The multi-level digital step attenuator as claimed in claim 1, wherein:
   the first electronic component, second electronic component, third electronic component, fourth electronic component, and fifth electronic component are resistors;
   each of the first electronic component and the second electronic component has a resistance of 36 ohm;
   the third electronic component has a resistance of 16 ohm; and
   each of the fourth electronic component and the fifth electronic component has a resistance of 96 ohm.

4. The multi-level digital step attenuator as claimed in claim 1, wherein the hybrid attenuation circuit further comprises:
   a sixth electronic component, coupled between the input node and the output node of the multi-level digital step attenuator when the hybrid attenuation circuit is in the second active state.

5. The multi-level digital step attenuator as claimed in claim 4, wherein:
   the T-type structure provides signal attenuation of 2^n dB or any attenuation of non-radix-2, and n is a positive integer; and
   the Pi-type structure provides signal attenuation of 2^(n−1) dB or any attenuation of non-radix-2.

6. The multi-level digital step attenuator as claimed in claim 4, wherein:
  the first electronic component, second electronic component, third electronic component, fourth electronic component, fifth electronic component, and sixth electronic component are resistors;
  each of the first electronic component and the second electronic component has a resistance of 36 ohm;
  the third electronic component has a resistance of 16 ohm;
  each of the fourth electronic component and the fifth electronic component has a resistance of 116 ohm; and
  the sixth electronic component has a resistance of 195 ohm.

7. The multi-level digital step attenuator as claimed in claim 1, wherein:
  the T-type structure provides signal attenuation of $2^n$ dB or any attenuation of non-radix-2, and n is a positive integer.

8. A digital step attenuation device, comprising:
  multiple stages of digital step attenuation units, wherein at least one digital step attenuation unit in the multiple stages is implemented by the multi-level digital step attenuator as claimed in claim 1.

9. The digital step attenuation device as claimed in claim 8, wherein:
  the digital step attenuation units form four stages numbered from 0 to 3;
  the digital step attenuation unit implemented by the multi-level digital step attenuator is in the number 3 stage;
  the T-type structure of the multi-level digital step attenuator implementing the digital step attenuation unit in the number 3 stage provides signal attenuation of 16 dB;

the Pi-type structure of the multi-level digital step attenuator implementing the digital step attenuation unit in the number 3 stage provides signal attenuation of 8 dB;
  when enabled, the digital step attenuation units in the number 0 stage, the number 1 stage, and the number 2 stage provide signal attenuation of 1 dB, 2 dB, and 4 dB, respectively; and
  the digital step attenuation device provides more than 16 attenuation levels.

10. The digital step attenuation device as claimed in claim 8, wherein:
  the multiple stages of digital step attenuation units are numbered from 0 to (m−1), and m is a positive integer greater than 1; and
  the digital step attenuation unit implemented by the multi-level digital step attenuator is in the number (m−1) stage.

11. The digital step attenuation device as claimed in claim 10, wherein:
  the T-type structure of the multi-level digital step attenuator implementing the digital step attenuation unit in the number (m−1) stage provides signal attenuation of $2^m$ dB; and
  the Pi-type structure of the multi-level digital step attenuator implementing the digital step attenuation unit in the number (m−1) stage provides signal attenuation of $2^{(m-1)}$ dB.

12. The digital step attenuation device as claimed in claim 11, wherein:
  when enabled, the digital step attenuation units in the number 0 to the number (m−2) stages provide signal attenuation of $2^0$ dB to $2^{(m-2)}$ dB, respectively.

13. The digital step attenuation device as claimed in claim 12, providing more than $2^m$ attenuation levels.

* * * * *